United States Patent [19]

Kauffman

[11] Patent Number: 5,189,592

[45] Date of Patent: Feb. 23, 1993

[54] ELECTRICAL FILTER WITH RESILIENTLY MOUNTED PLANAR DIELECTRIC DEVICES

[76] Inventor: George M. Kauffman, 14 Abigale Dr., Hudson, Mass. 01749

[21] Appl. No.: 811,636

[22] Filed: Dec. 23, 1991

[51] Int. Cl.⁵ .......................... H01G 4/00; H03H 9/58
[52] U.S. Cl. ...................................... 361/301; 333/187
[58] Field of Search .............. 361/301, 302, 306, 320, 361/321; 333/181–185

[56] References Cited

U.S. PATENT DOCUMENTS

| | | | |
|---|---|---|---|
| 4,314,213 | 2/1982 | Wakino | 333/182 |
| 4,317,093 | 2/1982 | Lungo | 333/187 |
| 5,112,253 | 5/1992 | Swift | 439/620 |

Primary Examiner—Donald A. Griffin
Attorney, Agent, or Firm—John E. Toupal; Harold G. Jarcho

[57] ABSTRACT

An electrical filter including a first electrode; a second electrode; a dielectric means connected between the first electrode and the second electrode; and a resilient coupling providing an electrical connection between the dielectric means and each of the first and second electrodes and permitting relative motion therebetween. The resilient coupling prevents fracture of the dielectric means.

19 Claims, 3 Drawing Sheets

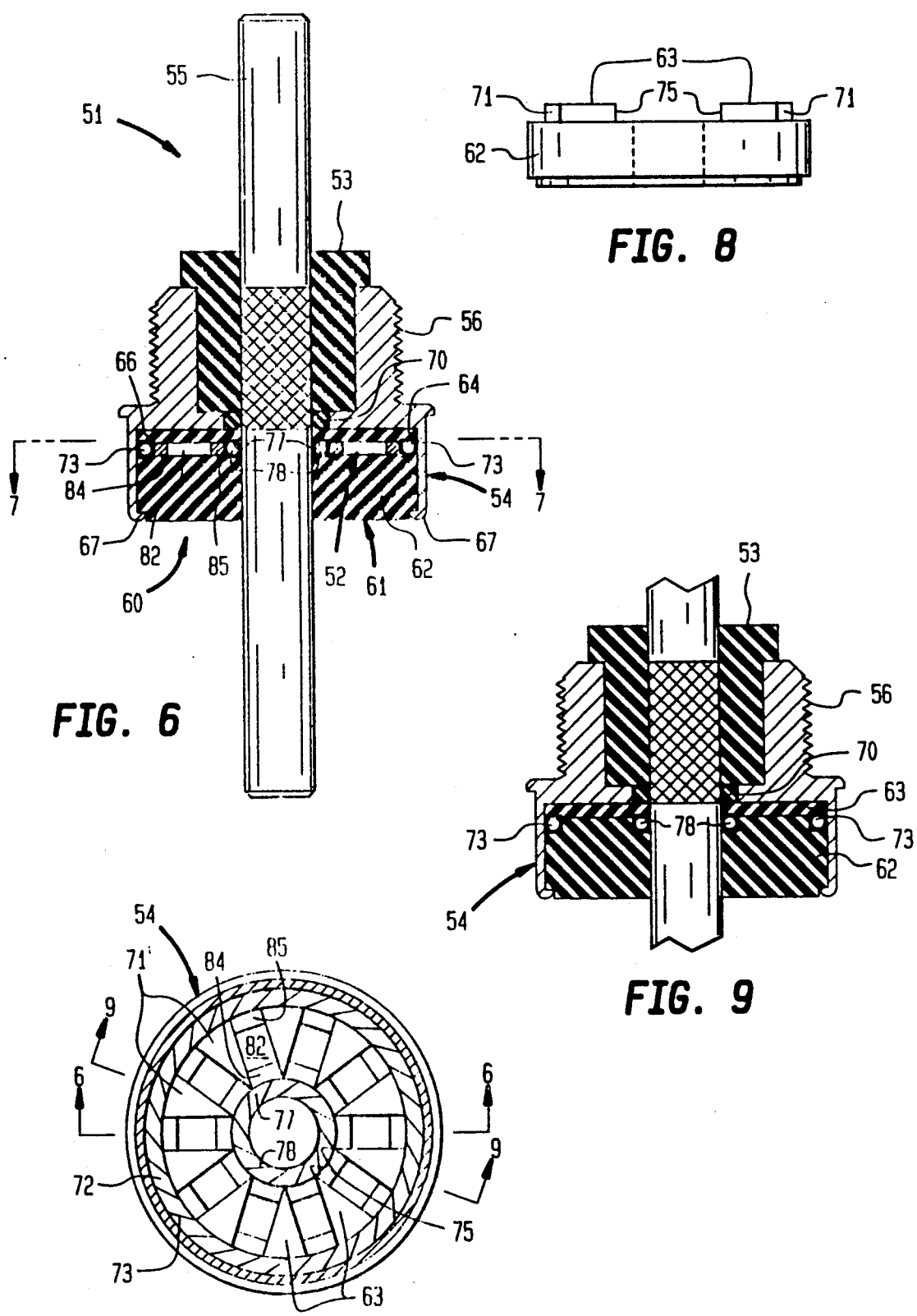

ELECTRICAL FILTER WITH RESILIENTLY MOUNTED PLANAR DIELECTRIC DEVICES

BACKGROUND OF THE INVENTION

This invention relates generally to high frequency feed-through electrical filters and, more particularly, to electrical filters using multiple capacitors constructed of planar dielectric devices.

Capacitive coupling to an electrical conductor at high frequencies is a critical element in passive low pass filters. The fundamentals of low pass filters are well established in the prior art. Design of the capacitive elements for such filters is a challenge, particularly at high frequencies. Discrete leaded capacitors are not suitable at high frequencies because of the inherent self inductance associated with even the shortest of leads. Any practical connection length in the capacitive circuit will interfere with the proper operation of a low pass filter, due to the inductance impedance of these leads.

Because of these deleterious effects, high frequency capacitors have here-to-fore been constructed using an annular configuration, in which the inside diameter effectively is one electrode of a capacitor, and the outside edge constitutes the other electrode of the capacitor. The annular volume is used to house a dielectric material. This variety of electrodes surface configurations to maximize the area affected by the dielectric. However, known annular configurations present several problems. In the cases in which ceramic dielectric is used, the resultant configurations are subject to breakage, if there is relative motion between a housing and an electrode. Also, the dielectric is difficult to form, and can be limited in dielectric volume because of practical size limitations. Furthermore, the exact geometry and thus capacitance value is difficult to control. For those cases in which the capacitor is of a wound film construction, voids and defects are chronic problems. The inspection and repair of wound film types is extremely difficult.

The object of this invention, therefore, is to provide an improved electrical filter.

SUMMARY OF THE INVENTION

The invention is an electrical filter including a first electrode; a second electrode; a dielectric means connected between the first electrode and the second electrode; and a resilient coupling providing an electrical connection between the dielectric means and each of the first and second electrodes and permitting relative motion therebetween. The resilient coupling prevents fracture of the dielectric means.

According to one feature of the invention, the dielectric means comprises a plurality of dielectric elements connected in parallel between the first and second electrodes and the resilient coupling provides an electrical connection between each of the elements and each of the electrodes. Prior to assembly of the filter, the plural dielectric elements can be preselected and matched to provide desired operating characteristics.

According to another feature of the invention, the resilient coupling comprises spring members connected between the dielectric elements and the electrodes. The spring members effectively provide the desired resiliency.

In one embodiment of the invention, each dielectric element has first and second ends; a first electrical terminal is fixed to the first end and connected to the first electrode; a second electrical terminal is spaced a given distance from the first electrical terminal, fixed to the second end and connected to the second electrode means; and the resilient coupling is connected to the electrical terminals over a contact surface area having dimensions substantially greater than the given distance. This arrangement establishes a desired intimate electrical contact to the dielectric elements.

According to one feature of this embodiment, the dielectric elements are dielectric discs having opposing planar faces defining the first and second ends, and the first and second terminals comprise electrically conductive coatings on the planar faces. The use of planar dielectric surfaces alleviates problems associated with prior use of annular shaped elements.

According to other features of this embodiment, each of the dielectric elements is a dielectric disc having opposing planar faces defining the first and second ends, the first and second terminals are formed by electrically conductive coatings on each of the planar faces; the second electrode is an electrode plate having opposing surfaces, the dielectric discs are substantially parallel to each other and the opposing surfaces, and the spring members connect the second terminals, respectively, to the opposing surfaces. This arrangement provides the desired filter in a compact, efficient configuration.

In another embodiment of the invention, each dielectric element has first and second ends; a first electrical terminal is fixed to the first end and connected to the first electrode; a second electrical terminal is spaced a given distance from the first electrical terminal, fixed to the second end and connected to the second electrode; and the resilient coupling provides an electrical connection having a length substantially less than the given distance. The short resilient coupling connections reduce undesirable, inherent self inductance of the filter.

According to other features of this embodiment; each dielectric element is a solid body of rectangular crossection and having opposing faces defining the first and second ends, the first and second terminals comprise electrically conductive coatings on the opposing faces, the first electrode comprises a cylindrical first electrode, the second electrode comprises a second electrode rod extending through the first electrode, and the dielectric elements form an array connected in parallel and extending radially between the first and second electrodes. This arrangement provides the desired filter in a highly compact configuration suitable for mounting in a housing.

According to other features of this embodiment, the resilient coupling comprises a first annular spring member connecting the first terminals of each dielectric element to the cylinder, and a second annular spring member connecting the second terminals of each dielectric element to the rod. The annular spring members establish in a compact configuration, the desired resilient coupling for the radial dielectric element array.

DESCRIPTION OF THE DRAWINGS

These and other objects and features of the invention will become more apparent upon a perusal of the following description taken in conjunction with the accompanying drawings wherein:

FIG. 6 is a vertical cross-sectional view of another capacitor device embodiment of the invention;

FIG. 7 is a cross-sectional view taken along lines 7—7 in FIG. 6;

FIG. 8 is an elevational view of a carrier body used in the device shown in FIGS. 6 and 7; and FIG. 9 is a cross-sectional view taken along lines 9—9 in FIG. 7.

DESCRIPTION OF THE PREFERRED EMBODIMENT

Figure 1:
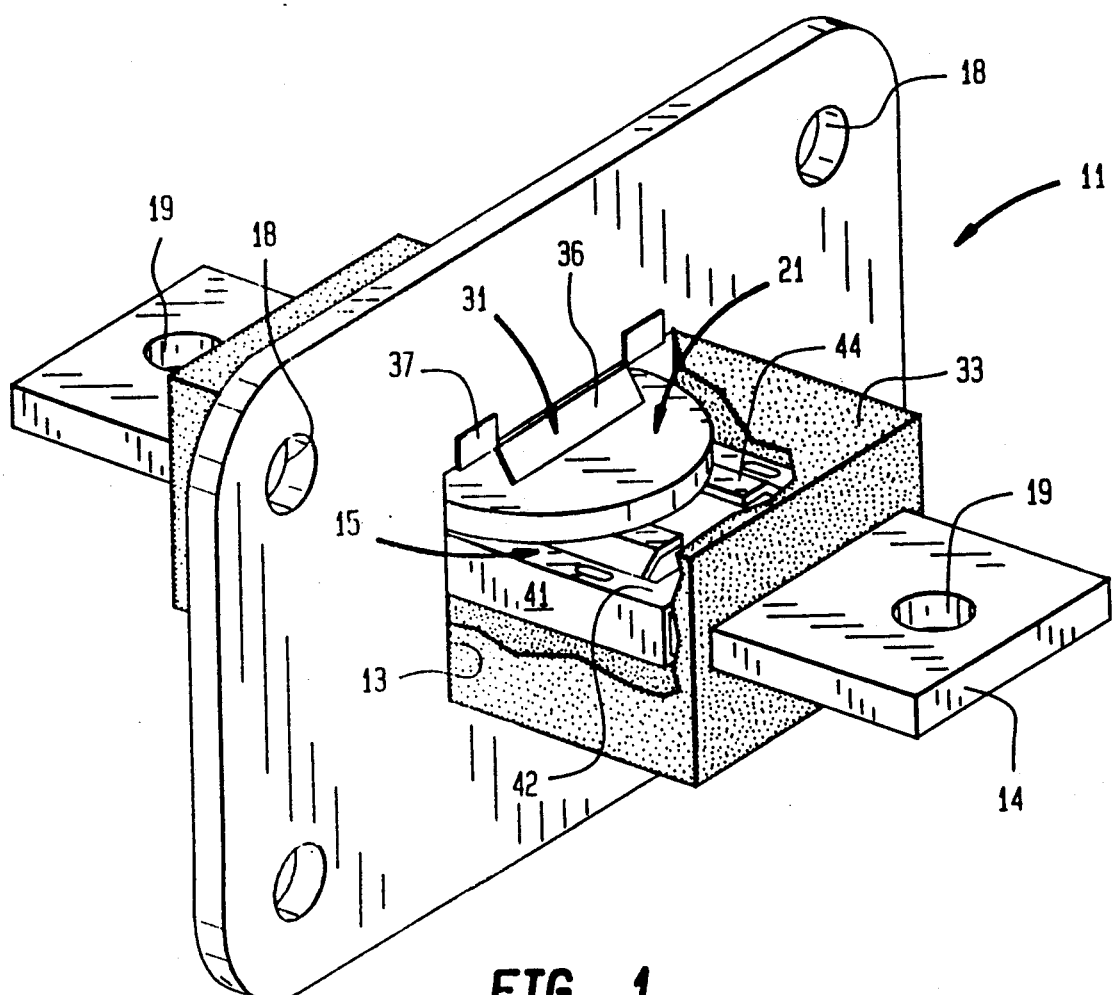
FIG. 1 is a perspective view of a capacitor device according to the invention.

A capacitor device 11 includes a first annular plate electrode 12 having a centrally located opening 13, a second plate electrode 14 extending through the opening 13 and spaced from the first electrode 12, and a dielectric body 15 electrically connected between the first electrode 12 and the second electrode 14. Formed at corners of the first electrode 12 are openings 18 for accommodating fasteners (not shown) used to mount the device 11 in an enclosure. Similar openings 19 formed at opposite ends of the second electrode 14 facilitate attachment of the second electrode 14 to electrical circuitry (not shown).

Figure 2:
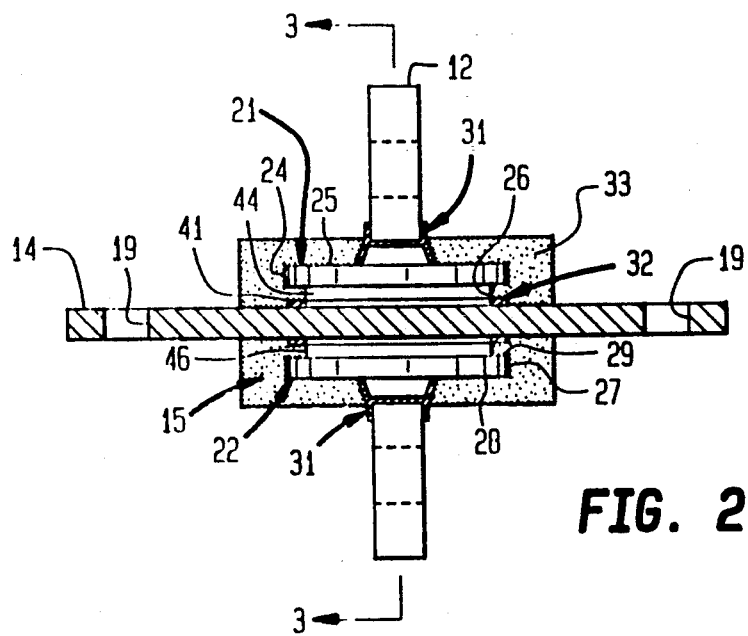
FIG. 2 is a cross-sectional device taken along lines 2—2 in FIG. 1.
Figure 3:
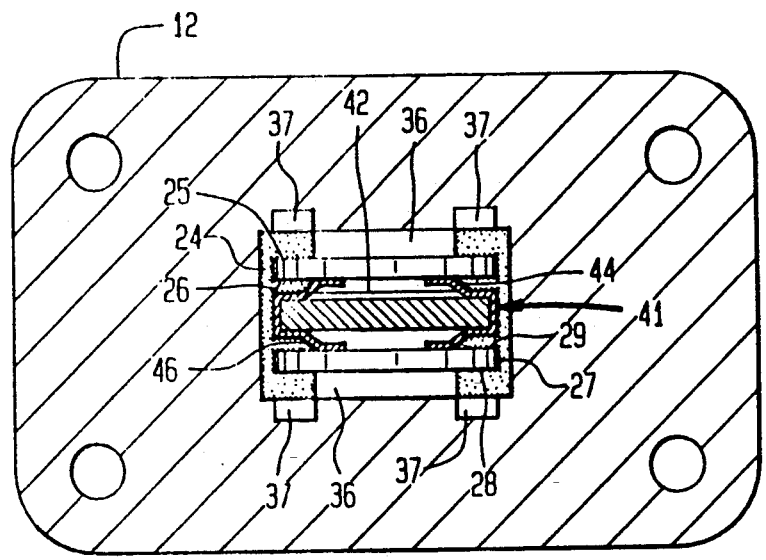
FIG. 3 is a cross-sectional view taken along lines 3—3 in FIG. 2.

As shown in FIGS. 2 and 3, the dielectric body 15 includes a first capacitor element 21 retained in the opening 13 between the first electrode 12 and one side of the second electrode 14 and a second capacitor element 22 also retained in the opening 13 between the first electrode 12 and an opposite side of the second electrode plate 14. The first capacitor element 21 is formed by a dielectric disc 24 having a first planar end surface metalized with an electrically conductive coating to provide a first terminal 25 and an opposite, second planar end surface metallized with an electrically conductive coating to provide a second terminal 26. Similarly, the second capacitor element 22 is formed by a dielectric disc 27 having first and second opposite planar end surfaces metalized with an electrically conductive coating to provide, respectively, first and second terminals 28, 29. As shown in FIGS. 2 and 3, the dielectric discs 24, 27 straddle the second electrode plate 14 and the opposing surfaces thereof are parallel to the planar electrodes 25, 26 of the first capacitor element 21 and the planar electrodes 28, 29 of the second capacitor element 22.

A resilient spring member 31 is mounted between the first electrode 12 and the first terminal 25 of the first capacitor element 21 and provides an electrical connection and permits relative movement therebetween. Mounted between one surface of the second electrode 14 and the second terminal 26 of the first capacitor element 21 is a resilient spring coupling 32 that also establishes an electrical connection and permits relative movement between the first capacitor element 21 and the second electrode 14. In the same manner, the second capacitor element 22 is electrically connected between the first electrode 12 and the second electrode 14 by a resilient spring member 31 mounted between the first terminal 28 and the first electrode 12 and the resilient spring coupling 32 that extends between the second terminal 28 and an opposite second surface of the second electrode 14. Thus, the first and second capacitor elements 21, 22 are electrically connected in parallel between the first and second electrodes 12, 14. Encapsulating the dielectric body 15 is a suitable electrical insulating potting material 33.

Figure 4:
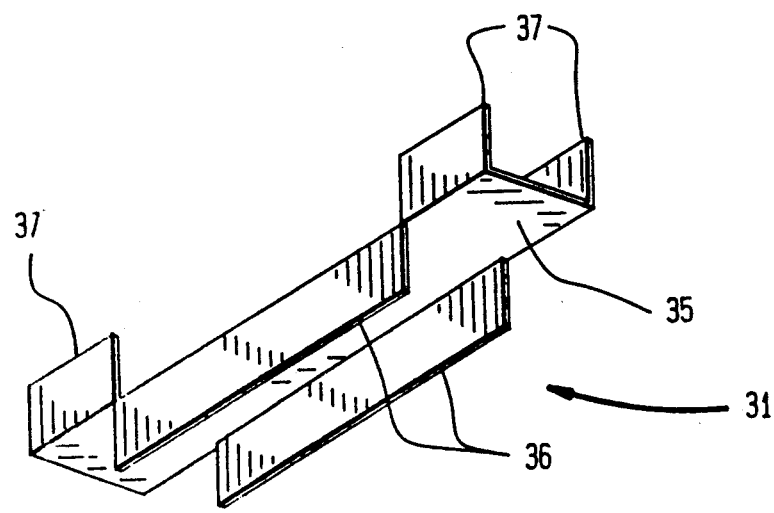
FIGS. 4 and 5 are perspective views of resilient coupling elements utilized in the device shown in FIGS. 1-3.

Each of the resilient spring members 31 (FIG. 4) has a flat base portion 35 that contacts an inner edge portion of the annular first electrode 12. Extending in one direction from the base portion 35 are parallel arm portions 36 that retainably engage opposite surfaces of the first electrode 12. A pair of leg portions 37 extend in opposite directions from each end of the base portion 35 and resiliently engage, respectively, the first electrodes 25, 28 of the first and second capacitor elements 21, 22. As shown, the leg portions 37 provide electrical contact over a surface of the first electrodes 25, 28 having an area with dimensions substantially greater than the spacing between the first and second electrodes 25, 26 and 28, 29.

Figure 5:
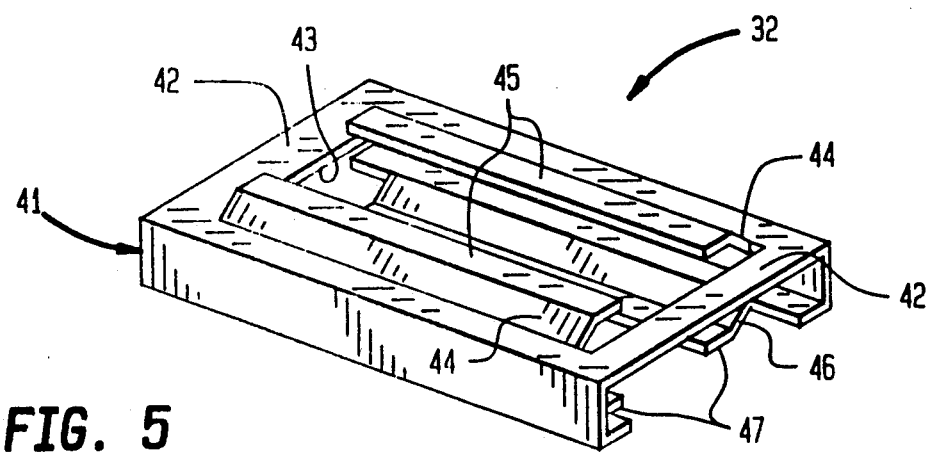

The spring coupling 32 (FIG. 5) has a casing portion 41 that encompasses the second electrode 14 so as to be retained thereby. Formed in one surface of the casing 41 between strut portions 42 is an opening 43. Resilient finger portions 44 having contact surfaces 45 extend in one direction from the opening 43 and engage the second electrode 26 of the first capacitor element 21. Extending in an opposite direction from an opposite surface of the casing portion 41 are resilient finger portions 46 with contact surfaces 47 that engage the second electrode 29 of the second capacitor element 22. The contact surfaces 45 and 47 also establish areas of electrical contact with dimensions substantially greater than the spacing between the first and second electrodes 25, 26 and 28, 29.

Another capacitive device embodiment 51 of the invention is shown in FIGS. 6-9. An array of capacitors 52 is retained within a first annular, cylindrical housing electrode 54 and a second rod electrode 55 is disposed concentrically therewithin. Formed on the cylindrical housing 53 is a threaded body portion 56 adapted for engagement in an enclosure (not shown). Opposite ends of the rod electrode 55 facilitate connection thereof to electrical circuitry (not shown). An annular insulator 53 is disposed between the threaded housing portion 56 and the rod electrode 55.

As shown in FIGS. 6 and 7, the capacitor array 52 is retained between the first electrode 54 and the second electrode 55 by a carrier body 61. Included in the carrier body 61 is an element 60 having an annular base portion 62 and a plurality of radially directed, circumferentially spaced apart wedge-shaped portions 63 supported thereby. Also included in the body 61 is an annular washer 64 engaging upper surfaces of the wedge-shaped portions 63. The carrier body 61 is retained between an internal shoulder 66 on the housing electrode 54 and an inwardly flared bottom end 67 thereof. Both the element 60 and the washer 64 are formed from suitable electrical insulating materials. An O-ring 70 is retained in an annular recess defined between the insulator 53, the housing portion 56 and the rod electrode 55.

The wedge-shaped portions 63 of the element 60 have circumferentially aligned outer edges 71 with a diameter smaller than equal outer diameters of the cylindrical base portion 62 and the washer 64 so as to define with the housing electrode 54 an annular groove 72 as shown in FIGS. 6-9. Retained within the groove 72 between the outer edges 71 and the housing electrode is an outer annular, coiled spring member 73 formed from a resilient, electrically conductive material. As also shown in FIGS. 6-9, inner apexes 75 of the wedge shaped portions 63 lie on a circumference having a diameter greater than equal inner diameters of the cylindrical base portion 62 and the washer 64 which conform to the outer diameter of the rod electrode 55. Thus, an inner annular groove 77 is formed between the apexes 75 and the rod electrode 55. Retained by the groove 77 between the apexes 75 and the rod electrode 55 is an inner annular, coiled spring member 78 formed from a resilient, electrically conductive material Together the element 60 and the washer 64 define between the wedge-shaped portions 63, radially directed slots 81, each of which retains a capacitor 52. Each capacitor 52 includes a dielectric body 82 of rectangular cross section and having first and second ends coated with electrically conductive material to provide, respectively, first and second electrical terminals 84, 85. The annular outer coiled spring 73 is compressed between the first housing electrode 54 and the first terminals 84 of each of the capacitor elements 52 so as to provide an electrical connection therebetween. In addition, the resilient spring member 73 permits relative movement between the housing electrode 54 and the capacitors 52 so as to prevent stress damage thereof. The annular, inner coil spring member 78 is compressed similarly between the second rod electrode 55 and the second end terminals 85 of each of the capacitors 52 so as to provide an electrical connection therebetween. Thus, the capacitors 52 are connected electrically in parallel between the first housing electrode 54 and the second rod electrode 55. In addition, the inner coil spring member 78 provides between the terminals 85 and the rod electrode 55, a resilient coupling that allows relative movement therebetween and thereby prevents stress damage to the capacitors 52. As shown in FIGS. 6 and 7, the spring members 73 and 78 establish electrical connections having lengths substantially less than the spacing between the first and second terminals 84, 85 on each of the capacitors 52.

Obviously, many modifications and variations of the present invention are possible in light of the above teachings. It is to be understood, therefore, that the invention can be practiced otherwise than as specifically described.

What is claimed is:

1. An electrical filter comprising:
   first electrode means;
   second electrode means;
   a plurality of dielectric elements connected in parallel between said first and second electrode means; and
   resilient means coupled to each of said dielectric elements and permitting relative motion between each of said dielectric elements and each of said first and second electrode means.

2. An electrical filter according to claim 1 wherein said resilient means comprises spring means.

3. An electrical capacitor device comprising:
   first electrode means;
   second electrode means;
   dielectric means with first and second ends;
   a first electrical terminal fixed to said first end and connected to said first electrode means;
   a second electrical terminal spaced a given distance from said first electrical terminal, fixed to said second end and connected to said second electrode means; and
   resilient means providing an electrical connection between at least one of said connected first electrical terminal and said first electrode means and said connected second electrical terminal and said second electrode means and permitting relative motion therebetween, and wherein said resilient means is connected to said at least one electrical terminal over a contact surface area having dimensions substantially greater than said given distance.

4. An electrical capacitor device according to claim 3 wherein said dielectric means is a dielectric disc having opposing planar faces defining said first and second ends, and said first and second terminals comprise electrically conductive coatings on said planar faces.

5. An electrical filter according to claim 4 wherein said resilient means comprises a spring means electrically connected between each of said first and second terminals and, respectively, each of said first and second electrode means and permitting relative motion therebetween.

6. An electrical filter according to claim 3 wherein said first electrode means comprises a first electrode defining an opening; said second electrode means comprises a second electrode extending through said opening; and said dielectric means comprises first and second capacitor elements disposed in said opening and connected in parallel by said resilient means between said first and second electrodes, each of said first and second capacitor elements having first and second ends with said first and second terminals fixed respectively thereto.

7. An electrical filter according to claim 6 wherein each of said first and second capacitor elements comprises a dielectric disc having opposing planar faces defining said first and second ends, and first and second terminals are formed by electrically conductive coatings on each of said planar faces; and said resilient means connect said first terminals to said first electrode and said second terminals to said second electrode.

8. An electrical filter according to claim 7 wherein said resilient means comprises a spring member connecting each of said first terminals to said first electrode and each of said second terminals to said second electrode.

9. An electrical filter according to claim 8 wherein said second electrode is an electrode plate having opposing surfaces, said dielectric discs are substantially parallel to each other and said opposing surfaces; and said spring members connect said second terminals, respectively, to said opposing surfaces 10. An electrical capacitor device comprising:
    first electrode means;
    second electrode means;
    dielectric means with first and second ends;
    a first electrical terminal fixed to said first end and connected to said first electrode means;
    a second electrical terminal spaced a given distance from said first electrical terminal, fixed to said second end and connected to said second electrode means; and
    resilient means providing an electrical connection between at least one of said connected first electrical terminal and said first electrode means and said connected second electrical terminal and said second electrode means and permitting relative motion therebetween, and wherein said resilient means provides an electrical connection having a length substantially less than said given distance.

11. An electrical filter according to claim 10 wherein said dielectric body is a solid body of rectangular cross-section and having opposing faces defining said first and second ends, and said first and second terminals comprise electrically conductive coatings on said opposing faces

12. An electrical filter according to claim 10 wherein said first electrode means comprises an annular first electrode, said second electrode means comprises a second electrode extending through said first electrode, and said dielectric means comprises a plurality of capacitor elements forming an array connected in parallel and extending radially between said first and second electrodes; each of said capacitor elements having first and second ends with first and second terminals fixed, respectively, thereto and connected, respectively, to said first and second electrodes.

13. An electrical filter according to claim 12 wherein said first electrode comprises a cylinder adapted for mounting in a housing, and said second electrode comprises a rod concentrically positioned in said cylinder.

14. An electrical filter according to claim 13 wherein said resilient means comprises a first annular spring member connecting said first terminals of each said capacitor element to said cylinder, and a second annular spring member connecting said second terminals of each said capacitor to said rod.

15. An electrical filter comprising:
an annular first electrode;
a second electrode extending through said first electrode; and
a plurality of dielectric elements connected in parallel between said first and second electrodes.

16. An electrical filter according to claim 15 wherein each said dielectric element comprises a capacitor element having a dielectric body with first and second ends, a first electrical terminal fixed to said first end and connected to said first electrode, and a second electrical terminal fixed to said second end and connected to said second electrode.

17. An electrical filter according to claim 16 wherein each said dielectric body is a dielectric disc having opposing planar faces defining said first and second ends, and said first and second terminals comprise electrically conductive coatings on said planar faces.

18. An electrical filter according to claim 17 wherein said second electrode is an electrode plate having opposing first and second surfaces, one of said capacitor elements is connected to said first surface with its said dielectric disc substantially parallel thereto, and another of said capacitor elements is connected to said second surface with its said dielectric disc substantially parallel thereto.

19. An electrical filter according to claim 16 wherein said first electrode is cylindrical, said second electrode is a rod concentrically disposed in said first electrode, and said plurality of capacitor elements form an array connected in parallel and extending radially between said first and second electrodes.

* * * * *